United States Patent
Rehder

(10) Patent No.: US 9,911,886 B2
(45) Date of Patent: Mar. 6, 2018

(54) LATERAL SOLAR CELL STRUCTURE

(75) Inventor: Eric M. Rehder, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 164 days.

(21) Appl. No.: 13/346,982

(22) Filed: Jan. 10, 2012

(65) Prior Publication Data

US 2013/0174893 A1    Jul. 11, 2013

(51) Int. Cl.
| | |
|---|---|
| *H01L 31/00* | (2006.01) |
| *H01L 21/00* | (2006.01) |
| *H01L 31/0735* | (2012.01) |
| *H01L 31/0304* | (2006.01) |
| *H01L 31/0352* | (2006.01) |

(52) U.S. Cl.
CPC .... *H01L 31/0735* (2013.01); *H01L 31/03048* (2013.01); *H01L 31/03529* (2013.01); *H01L 31/035227* (2013.01); *Y02E 10/544* (2013.01); *Y02P 70/521* (2015.11)

(58) Field of Classification Search
CPC ....... H01L 31/03048; H01L 31/035227; H01L 31/0735; H01L 31/03529; Y02E 10/544
USPC ....................................................... 136/259
See application file for complete search history.

(56) References Cited

U.S. PATENT DOCUMENTS

| | | | | |
|---|---|---|---|---|
| 2003/0089392 A1* | 5/2003 | Rohr | ....................... | B82Y 20/00 136/255 |
| 2006/0207647 A1* | 9/2006 | Tsakalakos | ............ | B82Y 20/00 136/256 |
| 2007/0111368 A1 | 5/2007 | Zhang et al. | | |
| 2007/0204901 A1* | 9/2007 | Dutta | ............................ | 136/256 |
| 2008/0110486 A1* | 5/2008 | Tsakalakos et al. | .......... | 136/244 |

(Continued)

FOREIGN PATENT DOCUMENTS

| | | |
|---|---|---|
| CN | 1855552 A | 11/2006 |
| EP | 1923918 A2 | 5/2008 |
| JP | 2008-177539 A | 7/2008 |

OTHER PUBLICATIONS

Smith et al., "Semiconductor Nanocrystals: Structure, Properties, and Band Gap Engineering," Acc. Chem. Res., 2010, 43 (2), pp. 190-200.*

(Continued)

*Primary Examiner* — Angelo Trivisonno
(74) *Attorney, Agent, or Firm* — Haynes and Boone, LLP

(57) ABSTRACT

A system, method, and apparatus for a lateral solar cell structure are disclosed herein. In particular, the present disclosure teaches a lateral solar cell structure that includes nanorods that are formed the during epitaxial growth process to produce electrodes extending into the absorber region. This structure allows for a long optical absorption length of the absorber, such as 0.5-3 microns, but also allows for carrier collection over sub-micron distances enabling high collection efficiency from materials with a sub-micron diffusion length. The disclosed method of manufacturing the lateral solar cell structure involves providing a substrate, and epitaxially growing an absorber region and an emitter region on the substrate. The emitter region comprises a plurality of nanorods extending into the absorber region. The absorber region and the nanorods are oppositely doped. The absorber region and the nanorods are also oppositely strained.

18 Claims, 4 Drawing Sheets

(56) References Cited

U.S. PATENT DOCUMENTS

| | | |
|---|---|---|
| 2008/0135089 A1 | 6/2008 | Tsakalakos et al. |
| 2011/0126891 A1* | 6/2011 | Goto et al. ............... 136/255 |
| 2011/0139209 A1 | 6/2011 | Lang et al. |
| 2011/0155236 A1* | 6/2011 | Goto ............... H01L 31/02167 136/256 |

OTHER PUBLICATIONS

Wu et al., "Charge Separation via Strain in Silicon Nanowires," Nano Lett., 2009, 9 (6), pp. 2418-2422.*

Sun, et al., "Extremely low density InAs quantum dots realized in situ on (100) GaAs", Institute of Physics Publishing, Nanotechnology, vol. 15, pp. 1763-1766 (2004).

Alloing, et al., "Growth and characterization of single quantum dots emitting at 1300 nm", Applied Physics Letters, vol. 86, pp. 101908-101908-3 (2005).

Hsieh, et al., "Growth of low density InGaAs quantum dots for single photon sources by metal-organic chemical vapour deposition", Institute of Physics Publishing, Nanotechnology, vol. 17, pp. 512-515 (2006).

Huang, et al., "Fabrication of ultra-low density and long-wavelength emission InAs quantum dots", Journal of Crystal Growth, vol. 301, pp. 751-754 (2007).

Kawaguchi, et al., "Optical properties of columnar InAs quantum dots on InP for semiconductor optical amplifiers", Applied Physics Letters, vol. 93, pp. 121908-121908-3 (2008).

Li, et al., "Extremely low density self-assembled InAs / GaAs quantum dots", Chinese Optics Letters, vol. 6, pp. 443-445 (2008).

Li, et al., "Controlling the Aspect Ratio of Quantum Dots: From Columnar Dots to Quantum Rods", IEEE Journal of Selected Topics in Quantum Electronics, vol. 14, No. 4, pp. 1204-1213 (2008).

Volz, et al., "Optimization of annealing conditions of (GaIn)(NAs) for solar cell applications", Journal of Crystal Growth, vol. 310, pp. 2222-2228 (2008).

Krenner, et al., "Growth and optical properties of self-assembled InGaAs quantum posts", Physica E, vol. 40, pp. 1785-1789 (2008).

Campesato, et al., "High Efficiency Solar Cells Based on AlInGaP", IEEE PVSC Conference, pp. 1112-1117 (2009).

Alonso-Alvarez, et al., "Strain Balanced Quantum Posts for Intermediate Band Solar Cells", IEEE PVSC Conference, pp. 928-933 (2010).

Le Donne, et al., "Optical and electrical characterization of AlGaInP solar cells", Solar Energy Materials and Solar Cells, vol. 94, pp. 2002-2006 (2010).

Alonso-Alvarez, et al., "Strain balanced quantum posts", Applied Physics Letters, vol. 98, pp. 173106-173106-3 (2011).

Extended European Search Report, Application No. 13150886.3-1508/2615649, dated Sep. 23, 2013.

Office Action dated Feb. 6, 2017 in Taiwanese Patent Application No. 10620133780 (20pages).

Notice of Reasons for Rejection dated December 13, 2016 in Japanese Patent Application No. 2013-002105 (6pages).

* cited by examiner

LATERAL SOLAR CELL STRUCTURE

BACKGROUND

The present disclosure relates to solar cells. In particular, it relates to lateral solar cell structures.

SUMMARY

The present disclosure relates to a method, system, and apparatus for a lateral solar cell structure. In one or more embodiments, the present disclosure teaches a photovoltaic cell that includes an absorber region, and an emitter region comprising a plurality of nanorods extending into the absorber region. In some embodiments, the absorber region and the nanorods are oppositely doped. In at least one embodiment, the nanorods are n-type and the absorber region is p-type. In some embodiments, the nanorods are p-type and the absorber region is n-type.

In one or more embodiments, the absorber region and the nanorods are formed of Group III-V alloys. In at least one embodiment, the absorber region is formed of gallium arsenide nitride (GaAsN), indium gallium arsenide nitride (InGaAsN), aluminum indium phosphide (AlInP), or aluminum indium gallium phosphide (AlInGaP). In some embodiments, the nanorods are formed of indium arsenide (InAs), indium gallium arsenide (InGaAs), gallium arsenide antimonide (GaAsSb), indium phosphide (InP), or indium gallium phosphide (InGaP).

In at least one embodiment, the photovoltaic cell has a bandgap greater than 2.0 electron volts (eV). In some embodiments, the photovoltaic cell has a bandgap less than 1.4 eV.

In one or more embodiments, the spacing between each of the nanorods is less than three (3) microns. In at least one embodiment, the diameter of each of the nanorods is between five (5) nanometers (nm) and 100 nm. In some embodiments, the total area of the nanorods is less than one percent (1%) of the total area of the absorber region.

In at least one embodiment, the nanorods and the absorber region are oppositely strained. In some embodiments, the nanorods are tensile strained, and the absorber region is compressively strained. In one or more embodiments, the nanorods are compressively strained, and the absorber region is tensile strained. In some embodiments, the absorber region has an absorption length of between one half (0.5) and three (3) microns. In at least one embodiment, the length of the nanorods is between fifty percent (50%) and one hundred percent (100%) of the absorption length.

In one or more embodiments, a method of making a photovoltaic cell involves providing a substrate. The method further involves epitaxially growing an absorber region and an emitter region on the substrate. In at least one embodiment, the emitter region comprises a plurality of nanorods extending into the absorber region. In some embodiments, the absorber region and the nanorods are oppositely doped.

In at least one embodiment, the nanorods and the absorber region are oppositely strained. In some embodiments, the absorber region has an absorption length of between one half (0.5) and three (3) microns. In one or more embodiments, the length of the nanorods is between 50% and 100% of the absorption length. In one or more embodiments, the spacing between each of the nanorods is less than three (3) microns. In some embodiments, the diameter of each of the nanorods is between five (5) nm and 100 nm. In at least one embodiment, the total area of the nanorods is less than one percent (1%) of the total area of the absorber region.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

DESCRIPTION

The methods and apparatus disclosed herein provide an operative system for a lateral solar cell structure. Specifically, this system includes multijunction solar cells including highly efficient subcells having optimal bandgap combinations. This system employs nanorods that are formed during the epitaxial growth process to produce electrodes extending into the absorber region of the solar cell. This design allows for a long optical absorption length of the absorber, such as 0.5-3 microns, but also allows for carrier collection over sub-micron distances matching the diffusion length.

Currently, the addition of N and Al to form alloys can produce desirable bandgaps, but the material quality tends to degrade resulting in short minority carrier diffusion lengths and low efficiencies. For example, the direct growth of cells made of materials such as InGaAsN and AlInGaP have been investigated. However, due to the low carrier diffusion length of these materials, cells formed of these materials are not highly efficient.

Figure 1:
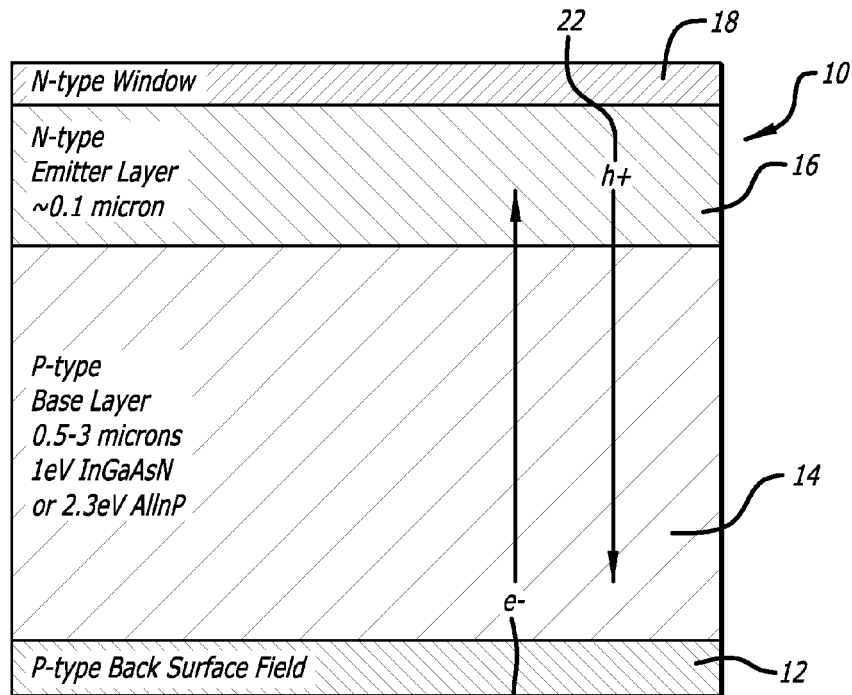
FIG. 1 is a schematic diagram of a subcell having optimal bandgap properties and low efficiency.

For example, FIG. 1 depicts a subcell component 10 formed by the direct growth approach. The subcell component 10 includes a p-type back surface field 12, a p-type base layer 14, an n-type emitter layer 16, and an n-type window 18. The base layer 14 may be formed of InGaAsN or AlInP. For high efficiency operation, electrons 20 created in the base layer 14 need to be able to cross the 0.5-3 micron thick base layer 14 to reach the emitter layer 16. Conversely, holes 22 created in the emitter layer 16 need to be able to cross the depletion region and reach the base layer 14. However, the sub-micron minority carrier length of InGaAsN and AlInP prevents this from occurring efficiently.

Another approach to forming cells having optimal bandgap properties is to utilize relaxed, metamorphic buffer layers. Many buffer layers are possible using the III-V alloys. A common approach to forming a 1 eV bandgap cell is to deposit a buffer layer consisting of InGaP alloys. The resulting cell is formed by InGaAs alloy having a 1 eV bandgap. However, the metamorphic buffer process is complex, making manufacturing difficult. In addition, the metamorphic buffer process results in increased film roughness and threading dislocation density, which reduces efficiency. The metamorphic buffer process also requires a very thick buffer layer, which is costly and reduces throughput.

Still another approach to forming cells having optimal bandgap properties is to utilize wafer bonding to integrate cells on GaAs and InP substrates. This approach requires two substrates and two growth processes forming cells on each substrate separately. Wafer bonding is used to attach these cells mechanically and electrically. At least one of the substrates is then removed to form the multijunction cell. Thus, the wafer bonding approach involves considerable expense required to have two film deposition processes, in addition to wafer bonding and substrate removal.

The disclosed system design allows for the fabrication of highly efficient subcells having optimal bandgap properties. By forming conducting nanorods imbedded in an absorber region of opposite conductivity type, the distance that the carriers have to travel is reduced, thereby increasing efficiency. In this manner, the disclosed system provides cells having higher efficiencies than those produced by the direct growth, metamorphic buffer, or wafer bonding approaches discussed above.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Figure 2:
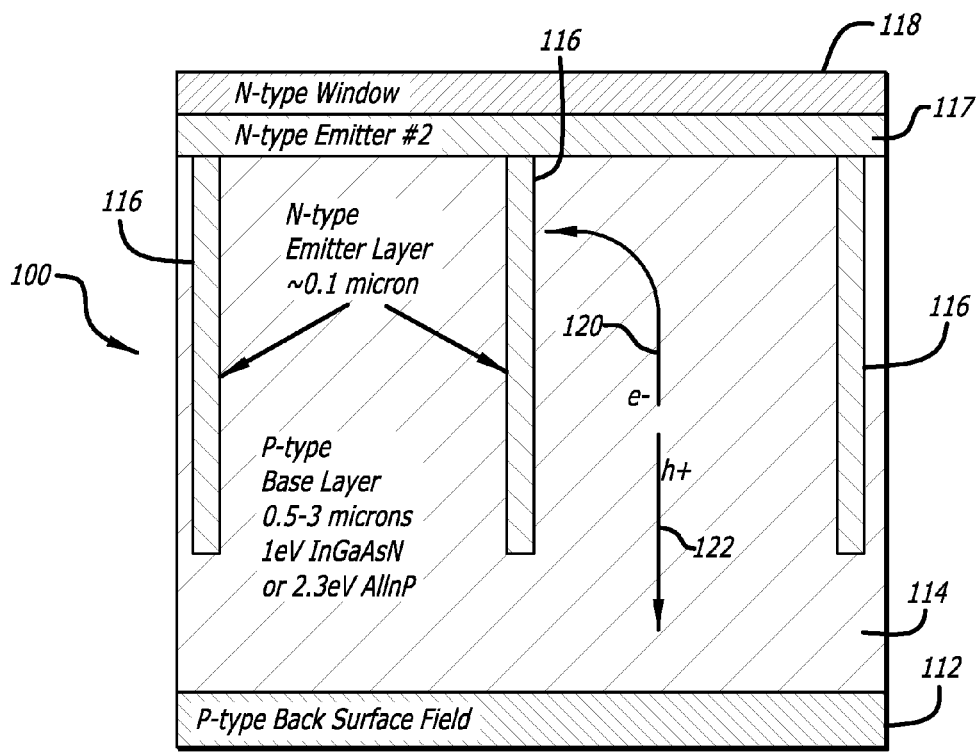
FIG. 2 is a schematic diagram of a subcell having optimal bandgap properties and high efficiency, in accordance with at least one embodiment of the present disclosure.

FIG. 2 depicts a subcell component 100 of a multijunction solar cell in accordance with the proposed design. The subcell component 100 includes a back surface field 112, an absorber region 114, an emitter region 116, a window 118, and optionally an additional emitter layer (Emitter #2) 117. The emitter region 116 is formed of a plurality of nanorods 116 extending into the absorber region 114. The absorber region 114 and the nanorods 116 are formed of Group III-V alloys. For example, the absorber region 114 may be formed of GaAsP, GaAsN, InGaAsN, AlInP, or AlInGaP. The nanorods 116 may be formed of InAs, InGaAs, GaAsSb, InP, or InGaP. These materials provide optimal bandgap ranges. For example, if a N alloy (e.g., GaAsN, InGaAsN) is used to form the absorber region 114, then the absorber region 114 will have a bandgap of less than 1.4 eV, e.g., in the range of 1.0 to 1.4 eV. If an Al alloy (e.g., AlInP, or AlInGaP) is used to form the absorber region 114, then the absorber region 114 will have a bandgap greater than 2.0 eV, e.g., in the range of 2.0 to 2.3 eV.

The absorber region 114 may have an absorption length of between 0.5 and 3 microns. The, length of the nanorods 116 is at least about half of the absorption length. For example, the length of the nanorods 116 may be between 50% and 100% of the absorption length.

The nanorods 116 and the absorber region 114 have opposite conductivities, thereby forming a PN junction. For example, the nanorods 116 may be n-type, and the absorber region 114 may be p-type. Alternatively, the nanorods 116 may be p-type and the absorber region 114 may be n-type.

As discussed in greater detail below, the nanorods 116 and the absorber region 114 are oppositely strained. For example, the nanorods 116 may be compressively strained, and the absorber region 114 may be tensile strained. Alternatively, the nanorods 116 may be tensile strained, and the absorber region 114 may be compressively strained.

The structure shown in FIG. 2 separates the path of the photons and charge carriers. The photon absorption length remains long at 0.5-3 microns, yet the carriers will have a submicron distance for collection. For example, as depicted in FIG. 2, an electron 120 created in the absorber region 114 is able to travel to the closest nanorod 116, rather than having to cross substantially the entire thickness of the absorber region in order to reach the emitter layer.

Figure 3B:
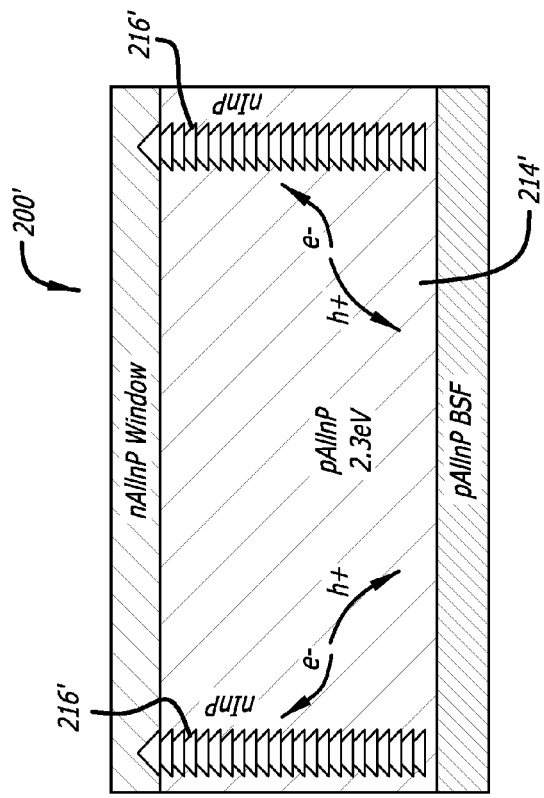
FIGS. 3A and 3B are schematic diagrams of exemplary embodiments of subcells having optimal bandgap properties and high efficiency, in accordance with embodiments of the present disclosure.
Figure 3A:
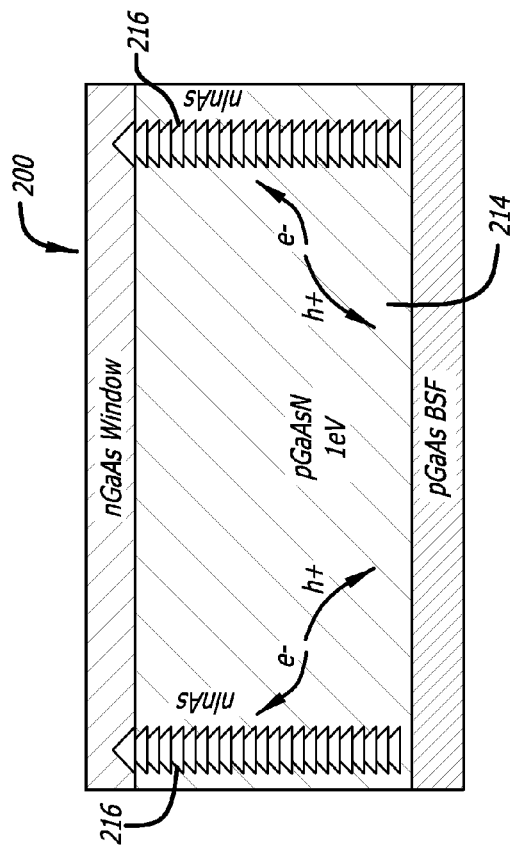

FIGS. 3A and 3B depict exemplary embodiments of subcells formed in accordance with the presently disclosed system. FIG. 3A depicts a cell 200 for 1.0 eV absorption having a p-type GaAsN absorber region 214 with n-type InAs nanorods 216. Alternatively, the cell 200 may have a p-type InGaAsN absorber region 214 and n-type InGaAs or GaAsSb nanorods 216. FIG. 3B shows a cell 200' for 2.3 eV absorption having a p-type AlInP absorber region 214' and n-type InP nanorods 216'. Alternatively, the 2.3 eV bandgap cell 200' may have a p-type AlInGaP absorber region 214' and n-type InGaP nanorods 216'.

Thick material having highly strained nanorods will form strain relieving crystallographic defects that will reduce solar cell efficiency. However, by utilizing a strain compensation approach, the presently disclosed system avoids such defects. That is, by balancing the strain of the nanorods with an absorber region of opposite strain (tensile vs. compressive), crystalline defects may be prevented. The examples shown in FIGS. 3A and 3B show tensile strained, p-type absorber regions 214, 214'. The nanorods 216, 216' in these examples are compressively strained, n-type nanorods 216, 216'. These conductivity and strain properties may be inverted without changing the key elements of the system. For example, the nanorods 216, 216' may be p-type and the absorber regions 214, 214' may be n-type. The nanorods 216, 216' may be tensile and the absorber regions 214, 214' may be compressive.

The collection efficiency for light absorption in the nanorods may be low. Thus, ensuring a low fractional coverage of the nanorods is desirable for maximizing cell efficiency. That is, the ratio of the total area of the nanorods to the total area of the absorber region should be minimized. In one embodiment, the total area of the nanorods is less than 1% of the total area of the absorber region.

Figure 4A:
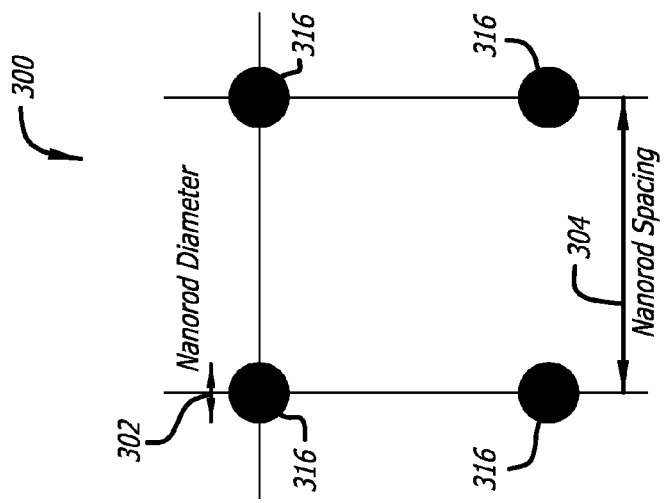
FIG. 4A is a top plan view of a subcell made in accordance with at least one embodiment of the present disclosure.
Figure 4:
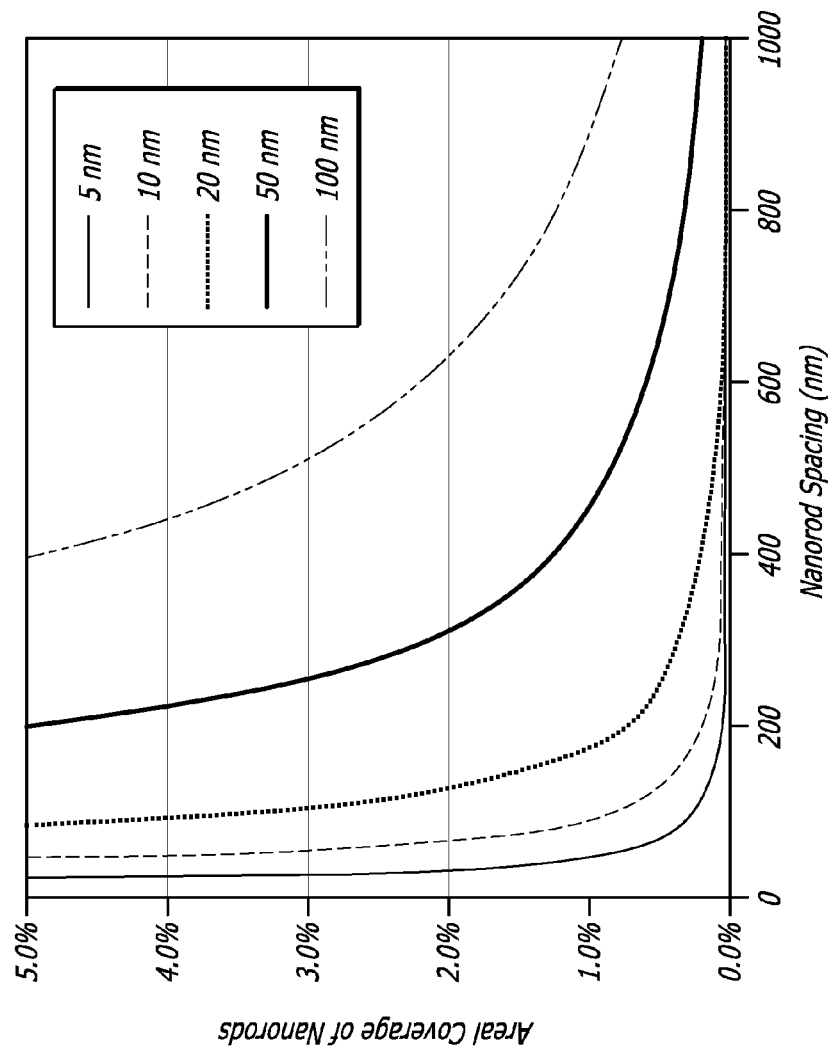
FIG. 4 is a graph illustrating the areal nanorod coverage for various combinations of nanorod diameter, and nanorod spacing, in accordance with at least one embodiment of the present disclosure.

FIG. 4A is a top-down view of a cell 300 formed in accordance with the presently disclosed system. FIG. 4A depicts the diameter 302 of each nanorod 316. FIG. 4A also depicts the spacing 304 between each nanorod 316. The nanorod diameter 302 and spacing 304 may be controlled by the growth conditions used. The diameter 302 may controllably be varied between 5 and 100 nm and the spacing 304 between nanorods 316 may controllably be varied up to 3 microns. This combination will allow the coverage of nanorods to remain below 1% as shown in FIG. 4. The graph in FIG. 4 shows that, for a particular desired cell efficiency, by maintaining the coverage of the nanorods below 1%, and by controlling the nanorod diameters to be in the range of 5 to 100 nm, nanorod spacing of less than 3 microns may be used. A structure using nanorods 20 nm in diameter and a spacing of 200 nm will have <1% coverage of the nanorods. This structure will yield an electron path length (120) of <100 nm, while allowing for an optically thick base layer of 0.5 to 3 microns. Therefore, high efficiency subcells can be formed from materials with low minority carrier diffusion lengths, such as InGaAsN or AlInP.

Figure 5:
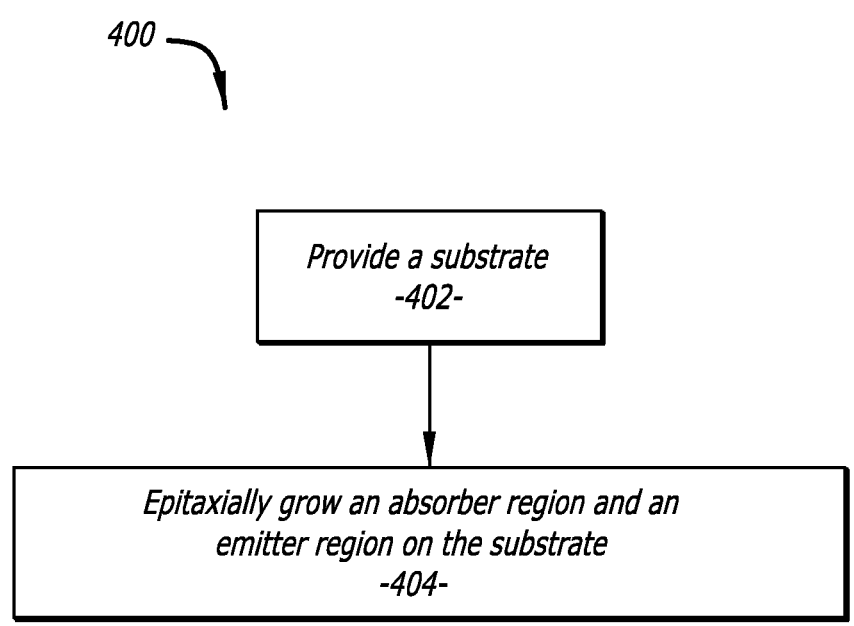
FIG. 5 is a flow diagram of a method for making the subcells illustrated in FIGS. 2, 3A, 3B, and 4A, in accordance with at least one embodiment of the present disclosure.

A method 400 of making a photovoltaic cell in accordance with the presently disclosed system is depicted in FIG. 5. The method includes a step 402 providing a substrate, and a step 404 of epitaxially growing an absorber region and an emitter region on the substrate. As discussed above, the emitter region comprises a plurality of nanorods extending into the absorber region, and the absorber region and the nanorods are oppositely doped. During the epitaxial growth, the nanorods are formed through strain driven self-organized clustering. Islands are closely stacked on top of each other to merge into a single, vertical nanorod. The strain of the nanorods is balanced by an oppositely strained absorber region.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A photovoltaic cell comprising:
   a plurality of nanorods, each of the plurality of nanorods comprising multiple strained portions of a same epitaxial crystalline material stacked on top of each other, wherein each of the portions comprises flared edges that extend an identical distance from a centerline of the respective nanorod;
   an emitter region comprising the plurality of nanorods extending into an absorber region, wherein each of the portions of the plurality of nanorods is oppositely strained to portions of the absorber region, wherein the absorber region comprising an epitaxial crystalline structure that completely fills all space between each of the nanorods of the plurality of nanorods; and
   wherein the absorber region and the plurality of nanorods are oppositely doped.

2. The photovoltaic cell of claim 1, wherein the plurality of nanorods are n-type and the absorber region is p-type.

3. The photovoltaic cell of claim 1, wherein the nanorods are p-type and the absorber region is n-type.

4. The photovoltaic cell of claim 1, wherein the absorber region and the plurality of nanorods are formed of Group III-V alloys.

5. The photovoltaic cell of claim 1, wherein the absorber region is formed of one of GaAsN, InGaAsN, AlInP, and AlInGaP.

6. The photovoltaic device of claim 1, wherein the nanorods are formed of one of InAs, InGaAs, GaAsSb, InP, and InGaP.

7. The photovoltaic cell of claim 1 having a bandgap greater than 2.0 electron volts (eV).

8. The photovoltaic cell of claim 1 having a bandgap less than 1.4 eV.

9. The photovoltaic cell of claim 1, wherein a spacing between each of the plurality of nanorods is less than 3 microns.

10. The photovoltaic cell of claim 1, wherein a diameter of each of the plurality of nanorods is between 5 nanometers (nm) and 100 nm.

11. The photovoltaic cell of claim 1, wherein a total areal coverage of the plurality of nanorods is less than 1% of the total area of the absorber region.

12. The photovoltaic cell of claim 1, wherein the plurality of nanorods are tensile strained and the absorber region is compressively strained.

13. The photovoltaic cell of claim 1, wherein the plurality of nanorods are compressively strained and the absorber region is tensile strained.

14. The photovoltaic cell of claim 1, wherein the absorber region has a length of between 0.5 and 3 microns, and wherein a length of the plurality of nanorods is between 50% and 100% of the length of the absorber region.

15. A method of making a photovoltaic cell comprising:
   providing a substrate; and
   epitaxially growing an absorber region and an emitter region on the substrate,
   wherein the emitter region comprises a plurality of nanorods, each of the plurality of nanorods comprising multiple strained portions of a same epitaxial crystalline material stacked on top of each other, wherein each of the portions comprises flared edges that extend an identical distance from a centerline of the respective nanorod, the plurality of nanorods extending into the absorber region,
   wherein the absorber region comprises an epitaxial crystalline structure that completely fills all space between each of the plurality of nanorods;
   wherein each of the portions of the plurality of nanorods is oppositely strained to portions of the absorber region,
   wherein the absorber region and the plurality of nanorods are oppositely doped.

16. The method of claim 15, wherein the absorber region has an absorption length of between 0.5 and 3 microns, and wherein a length of the nanorods is between 50% and 100% of the absorption length.

17. The method of claim 15, wherein a spacing between each of the nanorods is less than 3 microns, and a diameter of each of the nanorods is between 5 nm and 100 nm.

18. The method of claim 15, wherein a total areal coverage of the plurality of nanorods is less than 1% of the total area of the absorber region.

* * * * *